United States Patent [19]
Owen

[11] Patent Number: 5,594,362
[45] Date of Patent: Jan. 14, 1997

[54] GATABLE LEVEL-PULLING CIRCUIT

[75] Inventor: Jeffrey R. Owen, Portland, Oreg.

[73] Assignee: Seiko Communications Systems, Inc., Beaverton, Oreg.

[21] Appl. No.: 543,248

[22] Filed: Oct. 13, 1995

[51] Int. Cl.$^6$ .............................................. H03K 19/0175
[52] U.S. Cl. .............................................. 326/38; 326/86
[58] Field of Search .................................. 326/21, 33, 34, 326/37, 38, 86

[56]            References Cited
            U.S. PATENT DOCUMENTS 5,051,622  9/1991  Pleva ........................................ 326/38
5,111,079  5/1992  Steele ....................................... 326/38
5,432,465  7/1995  Hsi-Jung et al. ...................... 326/86 X

*Primary Examiner*—David R. Hudspeth
*Attorney, Agent, or Firm*—Elmer Galbi

[57]            ABSTRACT

Integrated circuit components automatically establish or disable a level-pulling condition relative to a given input IC pin as a function of detected signal activity at such IC pin, A logic signal responsive to signal activity at the IC pin drives the gate of a field effect transistor (FET) to dynamically establish or disable level-pulling function at the IC pin. Alternative embodiments include a flop-flop register and an OR gate driving the gate of the FET.

11 Claims, 3 Drawing Sheets

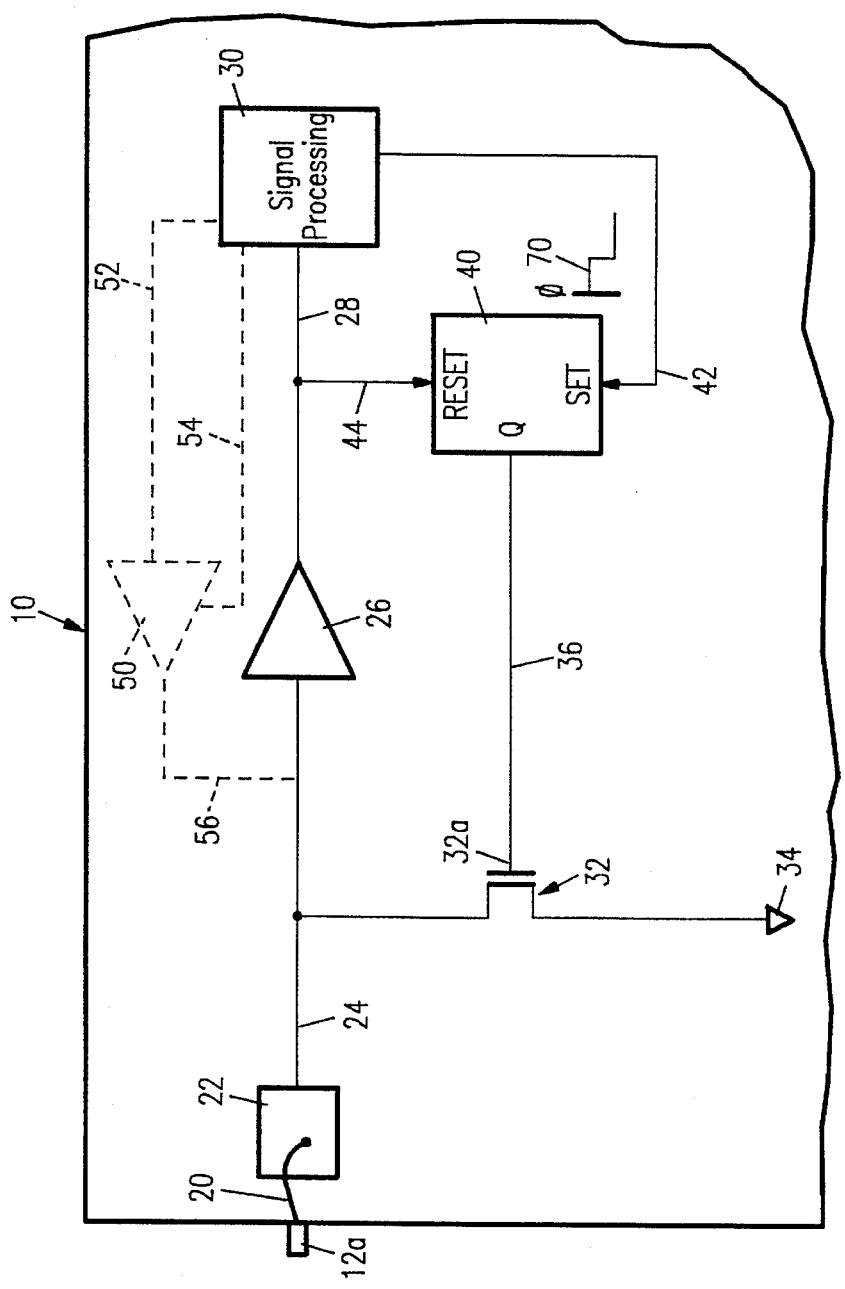
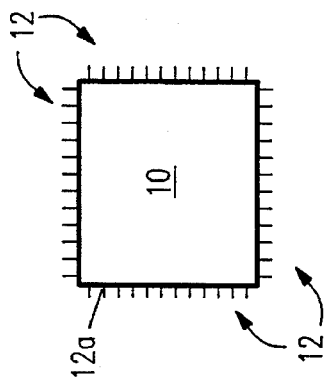
FIG. 2
FIG. 1

GATABLE LEVEL-PULLING CIRCUIT

FIELD OF THE INVENTION

The present invention relates generally to integrated circuit design and use, and in particular to integrated circuit design contemplating alternate uses or applications for a given integrated circuit design.

BACKGROUND OF THE INVENTION

Some applications of an IC may use certain IC pins, i.e. points of electrical contact for signal exchange between the IC device and an external device, while other applications of the same IC may not need these same IC pins. The subject matter of the present application concerns circuitry in an IC coupled to IC pins potentially not used in some contemplated applications of the IC device.

IC pins (such as IC pins for a high impedance logic signal input function) which are not connected to an external logic signal may tend to oscillate or cause excessive power consumption if not pulled to a stable logic signal state that is undriven or floating logic signal inputs are prone to oscillate or cause high current consumption especially in CMOS input buffers. Such oscillation or current consumption consumes unnecessary power and potentially disrupts other IC circuit signal processing.

A traditional solution to oscillation of floating logic input IC pins incorporates a "pull-up" or "pull-down" resistor coupled between the input IC pin and a positive or ground, respectively, potential. The level-pulling device, e.g., a pull-up or pull-down resistor, pulls the input IC pin to a given logic state to repress oscillation. When the input IC pin is not used. i.e.. the IC device is used in an application not requiring that particular IC pin, no oscillation occurs. If a particular IC pin is used, (i.e., coupled to an external device in a given application), an input signal at the IC pin must overcome the level-pulling device when driving the IC pin to a state opposite that established by the level-pulling device.

In extremely low power consumption applications, use of such level-pulling devices represents undesirable power consumption. Current drawn by the level-pulling device can be significant in extremely low power consumption applications. Accordingly, a level-pulling function should be established only when needed, and disabled at other times.

A high resistance field effect transistor (FET) having a small, long channel serves as "gatable" pull-down or pull-up resistor. A configuration device, such as a mask or data register, drives the gate of the FET to selectively establish or disable the level-pulling function of the FET. Use of the input IC pin must, however, be known at the time of manufacture, for the case of a mask-driven configuration device, or at the time of configuration, for the case of a data register-driven configuration device. If, following configuration in level-pulling mode, an input signal is applied to the input IC pin, the IC pin is undesirably in a level-pulling mode and excess power is devoted to overcoming the level-pulling device.

It would be desirable to establish a level-pulling function when needed and disable the level-pulling function when not needed without requiring establishment or disablement of the function at the time of manufacture or initial integrated circuit configuration or operation.

SUMMARY OF THE INVENTION

The present invention provides circuitry automatically establishing or disabling a level-pulling condition relative to a given input IC pin as a function of detected signal activity at such IC pin. A logic signal responsive to signal activity at the IC pin drives a level-pulling device to dynamically establish or disable a level-pulling function at the IC pin.

A level-pulling device for an integrated circuit device pin under the present invention includes a level-pulling element coupling the pin to a selected electrical potential. The level-pulling device includes a gate receiving a mode-setting signal selecting one of enabling level-pulling and disabling level-pulling by the level-pulling element relative to the pin. A mode-setting element produces the mode-setting signal as a function of signal activity at the pin.

An integrated circuit device under the present invention selectively responds to an external signal to establish or disable a level-pulling function. An electrical signal conductor couples the external signal to signal processing circuitry of the integrated circuit. A level-pulling device couples the signal conductor to a selected electrical potential. The level-pulling device dictates resistance between the signal conductor and the selected electrical potential. A first state of the level-pulling device establishes a level-pulling function relative to the signal conductor and a second state thereof disables the level-pulling function relative to the signal conductor. A mode-driving device responds to electrical potential at the signal conductor to drive the level-pulling device.

The subject matter of the present invention is particularly pointed out and distinctly claimed in the concluding portion of this specification. However, both the organization and method of operation of the invention, together with further advantages and objects thereof, may best be understood by reference to the following description taken with the accompanying drawings wherein like reference characters refer to like elements.

BRIEF DESCRIPTION OF THE DRAWINGS

For a better understanding of the invention, and to show how the same may be carried into effect, reference will now be made, by way of example, to the accompanying drawings in which:

FIG. 1 illustrates an integrated circuit (IC) device including pins used in only some intended applications for the IC device.

FIG. 2 illustrates, partially and in block diagram, circuitry internal to the IC device of FIG. 1 including circuitry relative to a potentially unused pin of the IC.

DETAILED DESCRIPTION OF THE PREFERRED EMBODIMENT

Figure 3:
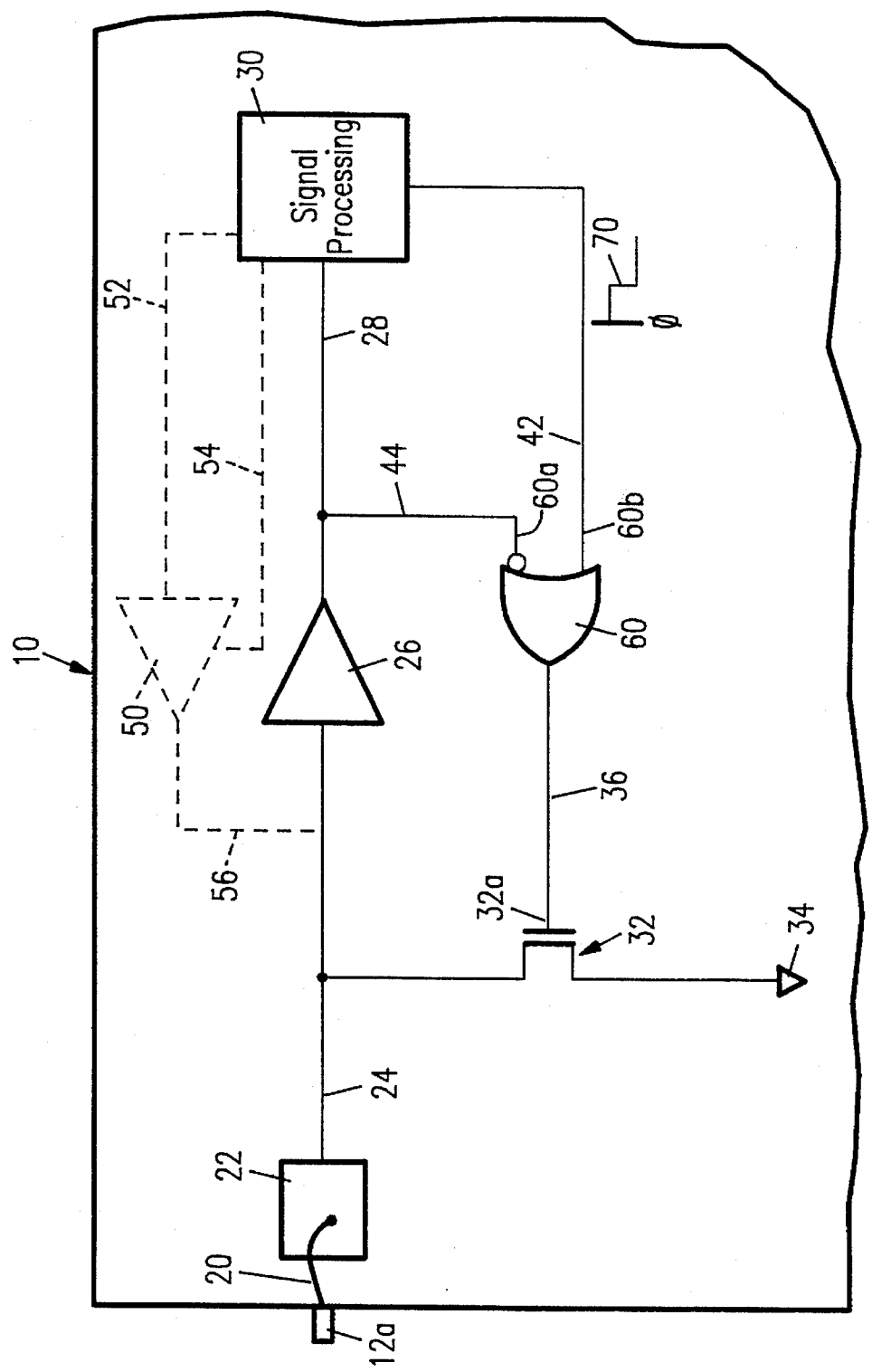
FIG. 3 is an alternative circuit relative to that shown in FIG. 2.

FIG. 1 illustrates an integrated circuit (IC) device 10 including about its periphery a plurality of pins 12 establishing electrical signal paths between integrated circuit 10 and external devices, not shown. With regard to the present disclosure, integrated circuit 10 includes certain ones of pins 12 which may or may not be used in a given selected application or use of integrated circuit 10. Pin 12a represents one of such pins 12. Pin 12a includes a logic signal input function which may or may not be relevant to a selected application for integrated circuit 10. If pin 12a is not used in a selected application for integrated circuit 10. pin 12a is unconnected or undriven relative to an external device. Pin 12a may, therefore, be considered a floating input of integrated circuit 10. Such floating or undriven inputs must be pulled to a stable logic value to avoid oscillation thereof.

FIG. 2 illustrates level-pulling circuitry of integrated circuit 10 relative to pin 12a. In FIG. 2, a bond wire 20 electrically couples pin 12a to a bond pad 22 of integrated circuit 10. Conductor 24 couples pad 22 to an input buffer 26. Conductor 28 couples the output of input buffer 26 to control and signal processing circuitry 30, not detailed herein but representing the remaining circuitry of integrated circuit 10. A high resistance field effect transistor (FET) 32 couples conductor 24 to a selected electrical potential, i.e., ground potential 34. FET 32 establishes or disables a level-pulling function relative to pin 12a.

A logic signal delivered via conductor 36 at FET gate 32a establishes or disables the level-pulling function of FET 32. In a first state, such logic signal establishes a level-pulling function by "closing" FET 32, i.e., providing a given magnitude resistance between conductor 24 and potential 34. In a second state, the logic signal applied to gate 32a "opens" FET 32 and presents a very high magnitude resistance between conductor 24 and potential 34 thereby disabling the level-pulling function of FET 32.

Integrated circuit 10 includes a flip-flop register 40, responsive to signal activity at pin 12a, to drive the gate 32a of FET 32. Conductor 36 couples the Q output of register 40 to gate 32a of FET 32. Register 40 includes a SET input and a RESET input. A conductor 42 couples to the SET input of register 40 to establish initialization of register 40. A conductor 44, couples conductor 28 and the RESET input of register 40 to drive register 40 dynamically during operation of integrated circuit 10 and thereby selectively establish or disable a FET 32 level-pulling function.

In operation, circuitry 30 initially drives conductor 42 with a pulse 70 of sufficient duration to set register 40, i.e., close FET 32, and establish a level-pulling function. As may be appreciated, pulse 70 could also originate from "off-chip", e.g., a global reset signal applied to several integrated circuits in addition to circuit 10. Register 40 maintains the level-pulling function at FET 32 by maintaining, in the particular arrangement illustrated, a logic value one on conductor 36. Thus, so long as pin 12a is unused, i.e., unconnected to an external signal, the level-pulling function remains and oscillation at pin 12a is repressed.

If, however, pin 12a is driven by an external signal, the circuitry illustrated in FIG. 2 automatically disables the level-pulling function provided by FET 32. More particularly, when a signal applied to pin 12a is opposite that established by the level-pulling function, then the signal present at conductors 28 and 44 asserts the RESET input of register 40 and thereby changes to a logic value zero the logic state applied to gate 32a of FET 32. Thus, when a signal applied to pin 12a drives pin 12a in a logic state opposite that of the level-pulling function, register 40 opens FET 32 to disable the level-pulling function. Thereafter, signal activity at pin 12a need not overcome a level-pulling function and power is conserved.

Also illustrated in FIG. 2, pin 12a may be an input/output pin by further incorporation of an output buffer 50 having a signal input conductor 52 and an output enable conductor 54 applied thereto. A conductor 56 couples the output of buffer 50 to conductor 24, thereby allowing signal processing circuitry 30 to selectively drive pin 12a.

Thus, integrated circuit 10 may be designed for a variety of applications, some of which may make use of pin 12a. To avoid oscillation at pin 12a when unconnected to an external device, the level-pulling function of FET 32 is enabled. At other times, i.e., when pin 12a is connected to an external device, FET 32 is disabled as a function of activity, i.e., logic signal activity, at pin 12a. In this manner, establishing or disabling a level-pulling function need not be determined at the time of integrated circuit 10 manufacture or initial configuration. Integrated circuit 10 dynamically responds to signal activity at pin 12a to selectively establish or disable the desired level-pulling function.

FIG. 3 illustrates an alternative mode-driving device, i.e., a mechanism driving FET 32 as a function of signal activity at pin 12a. In FIG. 3, register 40 is replaced with an OR gate 60. Conductor 36 couples the output of OR gate 60 to gate 32a of FET 32. Conductor 44 connects to an inverting input 60a of OR gate 60. Conductor 42 connects to a non-inverting input 60b of OR gate 60.

Figure 4:
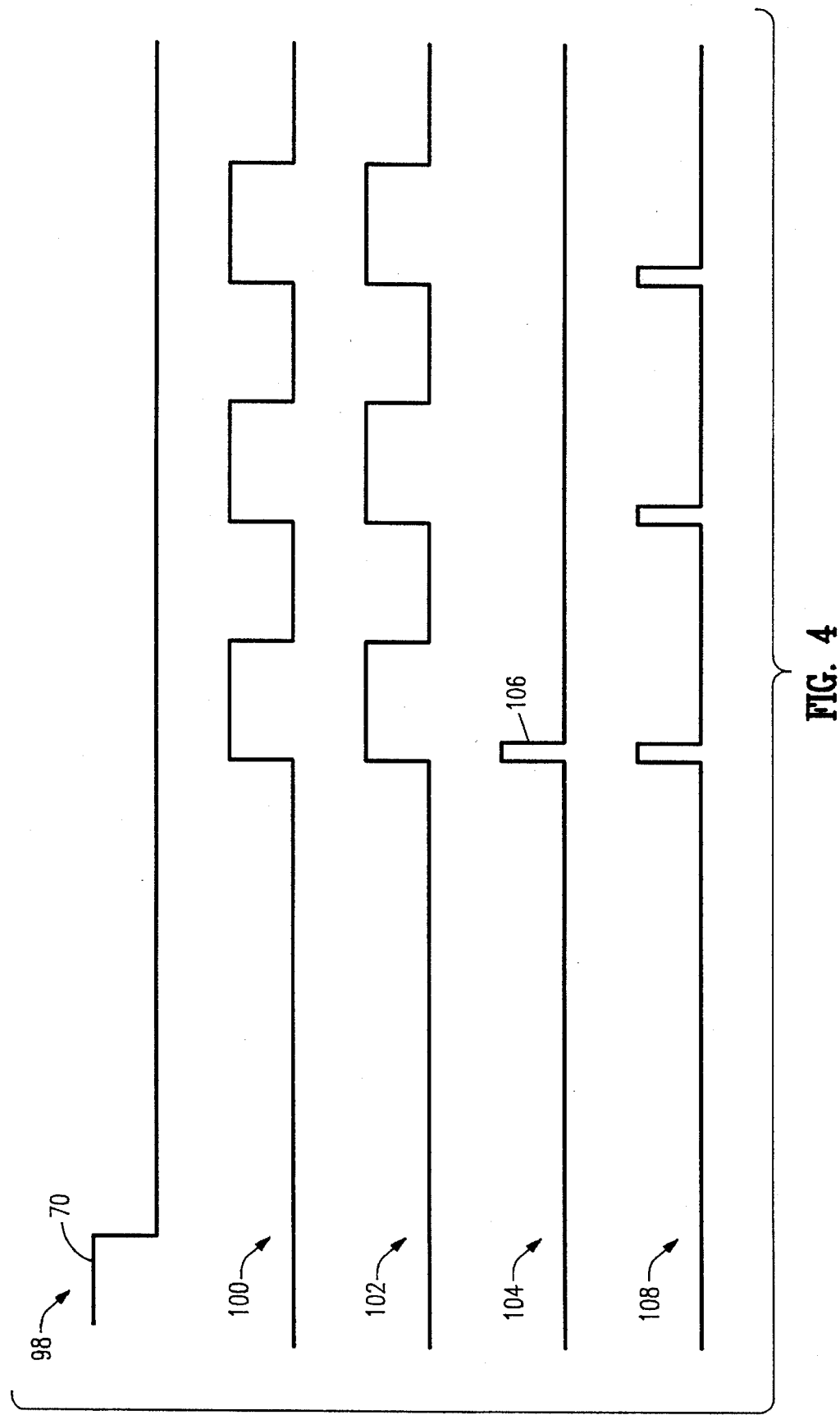
FIG. 4 illustrates signal waveforms including an input logic signal and corresponding waveforms representing current drawn in a traditional level-pulling device, the level-pulling device of FIG. 2, and the level-pulling device of FIG. 3.

In operation of the circuitry of FIG. 3, signal processing circuitry 30 provides an initial pulse 70 at conductor 42 to establish a level-pulling function at FET 32. More particularly, pulse 70 is of sufficient duration to cause FET 32 to close, thereby pulling the logic state at conductor 24, buffer 26, and conductors 28 and 44 to a logic zero condition. Such logic zero condition at conductor 44, i.e., the inverting input of OR gate 60, maintains FET 32 in its level-pulling mode. FET 32 remains in a level-pulling mode until a signal applied at pin 12a drives the logic state of conductor 24 in an opposite direction. More particularly, a logic value one arriving at pin 12a causes FET 32 to open, following inherent delay in elements 26, 60, and 32, thereby disabling the level-pulling function. The level-pulling function remains disabled until the signal applied to pin 12a again returns to a logic value zero. FIG. 4 illustrates waveforms representative of the circuitry of FIGS. 2 and 3. In FIG. 4, waveform 98 represents the initial pulse 70 establishing a level-pulling function. Waveform 100 corresponds to an logic input signal provided by an external device at pin 12a. Waveform 102 represents current drawn through a traditional level-pulling device, e.g., a pull-down resistor. Significant current passes through the traditional level-pulling device, i.e., during each occurrence of a logic value one in the waveform 100. Waveform 104 illustrates current drawn through FET 32 according to the arrangement illustrated in FIG. 2. A single pulse 106 of current passes through FET 32 upon the first occurrence of a logic value one presentation in waveform 100, i.e., at the first rising edge in waveform 100. Waveform 108 corresponds to current drawn through FET 32 under the arrangement illustrated in FIG. 3. Waveform 108 illustrates multiple occurrences of current passage through FET 32, i.e., one for each rising edge in the input waveform 100. Waveforms 104 and 108 illustrate a power conservation under the present invention relative to traditional level-pulling devices.

Thus, the present invention provides, for unconnected IC pins, a mechanism and method automatically disabling a level-pulling device to reduce the overall current consumed while repressing oscillation at a floating input pin of an integrated circuit. FET 32 is initially placed in a level-pulling mode to maintain a first logic state at the IC pin. However, if a second logic state signal is forced upon the pin, overcoming the level-pulling function, then circuitry of the present invention automatically disables the level-pulling function. This conserves power otherwise consumed in overcoming the level-pulling device, i.e., conserves power otherwise consumed in driving the input pin to a state opposite that established by a level-pulling device.

It will be appreciated that the present invention is not restricted to the particular embodiment that has been described and illustrated, and that variations may be made therein without departing from the scope of the invention as found in the appended claims and equivalents thereof. For example, while signal activity at the IC pin drives the level-pulling mode, other control schemes may be used in addition such as returning to a level-pulling mode following a given period of signal inactivity or by control circuitry resetting register 40 during a reset procedure of integrated circuit 10.

What is claimed is:

1. A level-pulling device for an integrated circuit device pin, the level-pulling device comprising:

a level-pulling element coupling said pin to a selected electrical potential, said level-pulling device including a gate receiving a mode-setting signal selecting one of enabling level-pulling and disabling level-pulling by said level-pulling element relative to said pin; and a mode-setting element producing said mode-setting signal as a function of signal activity at said pin.

2. A device according to claim 1 wherein said signal activity includes a logic signal state opposite that established by said level-pulling element.

3. A device according to claim I wherein said mode-setting element comprises a register maintaining said mode-setting signal.

4. A device according to claim 1 wherein said mode-setting element comprises an OR gate.

5. A device according to claim 1 wherein said level-pulling element comprises a field effect transistor having a gate receiving said mode-setting signal.

6. An integrated circuit device selectively responsive to an external signal, said integrated circuit device comprising:

an electrical signal conductor for coupling said external signal to signal processing circuitry of said integrated circuit;

a level-pulling device coupling said signal conductor to a selected electrical potential, said level-pulling device dictating resistance between said signal conductor and said selected electrical potential, a first state of said level-pulling device establishing a level-pulling function relative to said signal conductor and a second state thereof disabling a level-pulling function relative to said signal conductor; and a mode-driving device responsive to electrical potential at said signal conductor to drive said level-pulling device.

7. A device according to claim 6 wherein said signal conductor comprises a first portion electrically coupled to an external pin of said integrated circuit device and a second portion comprising an input buffer logically coupling said first portion and said signal processing circuitry of said integrated circuit device.

8. A device according to claim 6 wherein said level-pulling device is a field effect transistor.

9. A device according to claim 6 wherein said mode-driving device is a latch for maintaining a selected state of said gate.

10. A device according to claim 6 wherein said mode-driving device is a logic gate driving said gate in duration corresponding to the condition of said signal conductor.

11. A device according to claim 10 wherein said mode-driving device comprises an OR gate.

* * * * *